United States Patent
Zhang et al.

(10) Patent No.: US 9,966,265 B2
(45) Date of Patent: May 8, 2018

(54) METHOD OF HIGH VOLTAGE DEVICE FABRICATION

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Shuai Zhang, Shanghai (CN); Bo Hong, Shanghai (CN); Jui Lin Lu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days. days.

(21) Appl. No.: 15/346,570

(22) Filed: Nov. 8, 2016

(65) Prior Publication Data
US 2017/0221711 A1    Aug. 3, 2017

(30) Foreign Application Priority Data
Feb. 2, 2016   (CN) .......................... 2016 1 0073065

(51) Int. Cl.
*H01L 21/266*    (2006.01)
*H01L 29/66*     (2006.01)
(Continued)

(52) U.S. Cl.
CPC ...... *H01L 21/266* (2013.01); *H01L 21/26513* (2013.01); *H01L 21/76235* (2013.01);
(Continued)

(58) Field of Classification Search
None
See application file for complete search history.

(56) References Cited

U.S. PATENT DOCUMENTS 6,174,787 B1 *   1/2001   Fuller ............... H01L 21/76232
                                                         257/E21.549
6,265,282 B1     7/2001   Lane et al.
(Continued)

OTHER PUBLICATIONS

European Application No. 17152666.8, Extended European Search Report dated May 22, 2017, 7 pages.

*Primary Examiner* — Angel Roman
(74) *Attorney, Agent, or Firm* — Kilpatrick Townsend and Stockton LLP

(57) ABSTRACT

A method for manufacturing a semiconductor device includes providing a substrate structure including a substrate having multiple structures. Each of the structures includes an active region isolated by trenches in the substrate, an insulating layer on the active region, and a hardmask layer on the insulating layer. The method also includes performing a first ion implantation into a first structure configured to form a first type device, performing a pull-back process on the hardmask layer and on the insulating layer of the first structure to form a receded hardmask layer and a receded insulating layer and expose a corner portion of the active region, and performing a rounding process on the exposed corner portion. The rounded corner portion of the active region has an increased curvature radius that reduces the concentration of the electric field and improves the reliability of the semiconductor device.

19 Claims, 16 Drawing Sheets

(51) Int. Cl.
*H01L 21/762* (2006.01)
*H01L 21/265* (2006.01)
*H01L 21/308* (2006.01)
*H01L 21/311* (2006.01)
*H01L 21/3115* (2006.01)
*H01L 21/32* (2006.01)

(52) U.S. Cl.
CPC .... *H01L 29/66553* (2013.01); *H01L 21/3081* (2013.01); *H01L 21/31111* (2013.01); *H01L 21/31155* (2013.01); *H01L 21/32* (2013.01)

(56) References Cited

U.S. PATENT DOCUMENTS

| | | | |
|---|---|---|---|
| 6,281,050 B1 * | 8/2001 | Sakagami | H01L 27/105 257/E21.689 |
| 7,221,030 B2 * | 5/2007 | Saito | H01L 21/76229 257/296 |
| 2002/0011644 A1 | 1/2002 | Lee | |
| 2002/0130374 A1 * | 9/2002 | Ueno | H01L 27/105 257/392 |
| 2003/0132428 A1 * | 7/2003 | Agarwal | H01L 21/823481 257/1 |
| 2004/0005764 A1 * | 1/2004 | Wu | H01L 21/76235 438/400 |
| 2005/0009292 A1 | 1/2005 | Choi et al. | |

* cited by examiner

METHOD OF HIGH VOLTAGE DEVICE FABRICATION

CROSS-REFERENCES TO RELATED APPLICATIONS

This application claims priority to Chinese patent application No. 201610073065.8, filed on Feb. 2, 2016, the content of which is incorporated herein by reference in its entirety.

FIELD OF THE INVENTION

The present disclosure generally relates to semiconductor technology, and in particular, to a method for manufacturing a semiconductor device with an active region having an increased corner curvature radius.

BACKGROUND OF THE INVENTION

Currently, high-voltage devices typically have a relatively thick gate oxide layer to withstand high voltage. However, compared with the flat portion of the oxide layer formed on the active region, the oxide layer formed at a corner portion of the active region is relatively thin. This results in a higher electric field at the corner portion of the active region, and the field distribution is concentrated at the corner portion of the active region, thus reducing the reliability of a semiconductor device. In order to overcome the problems of an oxide layer at the corner of the active region that is thinner than the thickness of the oxide layer on a flat surface, current techniques generally increases the thickness of the gate oxide layer. However, such techniques have only limited effect in improving the oxide thickness at the corner of the active region.

In addition, in order to maintain maximum operating voltage, high-voltage devices also require a large isolation well region.

BRIEF SUMMARY OF THE INVENTION

Embodiments of the present invention provide a manufacturing method of a semiconductor device that can solve the above described problems.

In some embodiments, a method for manufacturing a semiconductor device includes providing a substrate structure including a substrate having a plurality of structures, each of the structures has an active region isolated by trenches, an insulating layer on the active region, and a hardmask layer on the insulating layer. The method also includes performing a first ion implantation into a first structure configured to form a first type device, performing a pull-back process on the hardmask layer and on the insulating layer of the first structure to form a receded hardmask layer and a receded insulating layer and expose a corner portion of the active region, and performing a rounding process on the exposed corner portion.

In one embodiment, the method further includes, prior to performing the pull-back process, performing a second ion implantation into a first trench adjacent to the first structure to form a first doped region in the substrate at a bottom of the first trench. The second ion implantation has an energy lower than an energy of the first ion implantation.

In one embodiment, performing the second ion implantation includes a source material including phosphorus or arsenic, an energy in a range between 8 keV and 60 keV, and a dose in a range between $5\times10^{12}$ and $1\times10^{14}$ atoms/cm$^2$. Alternatively, performing the second ion implantation includes a source material including boron or boron fluoride, an energy in a range between 5 keV and 30 keV, and a dose in a range between $5\times10^{12}$ and $1\times10^{14}$ atoms/cm$^2$.

In one embodiment, the substrate structure may further include a second structure configured to form a second type device, the method further includes, prior to performing the first ion implantation, forming a first barrier layer on the second structure, and removing the first barrier layer after the second ion implantation and prior to performing the pull-back process.

In one embodiment, the method may also include, after removing the first barrier layer, forming a second barrier layer on the first structure while exposing the second structure, and performing a third ion implantation into the second structure.

In one embodiment, the method may further include performing a fourth ion implantation into a second trench adjacent to the second structure to form a second doped region in the substrate at a bottom of the second trench. The fourth ion implantation has an energy lower than an energy of the third ion implantation.

In one embodiment, performing the fourth ion implantation includes a source material including phosphorus or arsenic, an energy in a range between 8 keV and 60 keV, and a dose in a range between $5\times10^{12}$ and $1\times10^{14}$ atoms/cm$^2$. Alternatively, performing the fourth ion implantation includes a source material including boron or boron fluoride, an energy in a range between 5 keV and 30 keV, and a dose in a range between $5\times10^{12}$ and $1\times10^{14}$ atoms/cm$^2$.

In one embodiment, performing the third ion implantation includes a source material including phosphorus or arsenic, an energy in a range between 100 keV and 700 keV, and a dose in a range between $1\times10^{12}$ and $8\times10^{12}$ atoms/cm$^2$; or a source material including boron, an energy in a range between 60 keV and 300 keV, and a dose in a range between $1\times10^{12}$ and $8\times10^{12}$ atoms/cm$^2$.

In one embodiment, the substrate structure further comprises a third structure configured to form a third type device, the third type device has an operating voltage lower than an operating voltage of the first type device. The first barrier layer is formed on the third structure, and the second barrier layer is formed on the third structure.

In one embodiment, the substrate structure further comprises a third structure configured to form a third type device, the third type device having an operating voltage lower than an operating voltage of the first type device; the method further includes, prior to performing the second ion implantation, forming a third barrier layer on the third structure.

In one embodiment, the method also includes, after performing the rounding process, filling the first trench with an insulating material.

In one embodiment, the method further includes, after filling the first trench, removing the hardmask layer and the insulating layer to expose the active region, and forming a gate structure on the active region.

In one embodiment, the insulating material includes silicon oxide.

In one embodiment, performing the rounding process includes oxidizing the exposed corner portion and forming an oxide layer on the bottom and sidewalls of the first trench.

In one embodiment, performing the first ion implantation includes a source material including phosphorus or arsenic, an energy in a range between 100 kEV and 700 keV, and a dose in a range between $1\times10^{12}$ and $8\times10^{12}$ atoms/cm2, or a source material including boron, an energy in a range between 60 keV and 300 keV, and a dose in a range between $1 \times 10^{12}$ and $8 \times 10^{12}$ atoms/cm2.

In one embodiment, the substrate structure further includes a second structure configured to form a second device, the method further includes, prior to performing the first ion implantation, forming a first barrier layer on the second structure.

In one embodiment, the substrate structure further includes a third structure configured to form a third type device, the third type device having an operating voltage lower than an operating voltage of the first type device; the method further comprising, prior to performing the first ion implantation, forming a third barrier layer on the third structure.

In one embodiment, the insulating layer includes silicon oxide, and the hardmask layer comprises silicon nitride. The active region is a well region The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
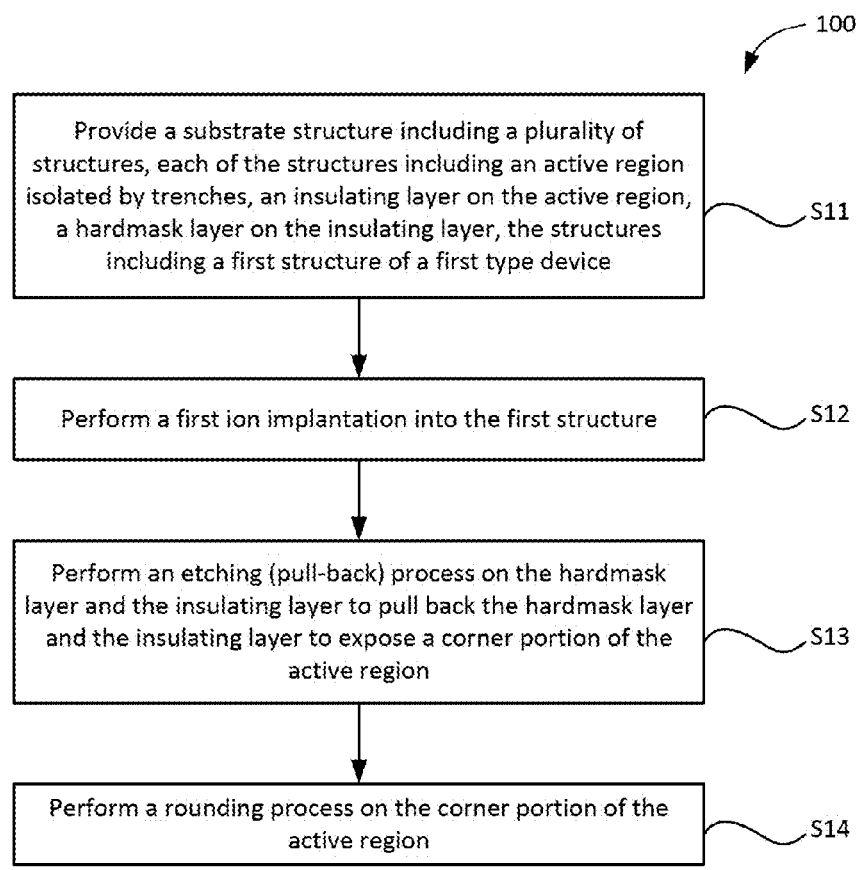
FIG. 1 is a flowchart of a manufacturing method of a semiconductor device according to some embodiments of the present disclosure.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The use of the terms first, second, third, etc. do not denote any order, but rather the terms first, second, third, etc. are used to distinguish one element from another. Furthermore, the use of the terms a, an, etc. does not denote a limitation of quantity, but rather denote the presence of at least one of the referenced items.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

In accordance with some embodiments of the present disclosure, FIG. 1 provides a flowchart showing a manufacturing method 100 of a semiconductor device. FIGS. 2A through 2G are cross-sectional views of intermediate structures for describing a method for manufacturing a semiconductor device according to some embodiments of the present disclosure.

Figure 2A:
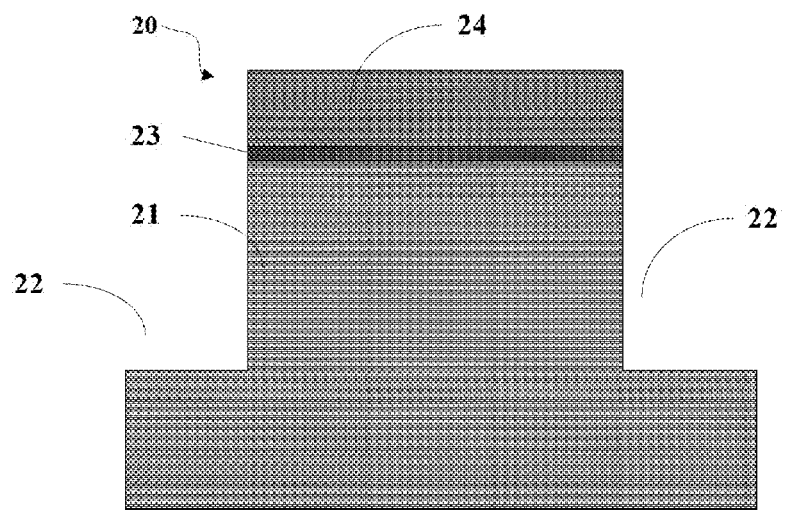
FIG. 2A is a cross-sectional view showing an intermediate structure for describing a manufacturing method of a semiconductor device according to some embodiments of the present disclosure.

Method 100 may include the following steps:

Step S11: providing a substrate structure including a substrate having multiple structures. Each of the structures includes an active region 21 separated by trenches, an insulating layer (e.g., a buffer oxide layer) 23 on active region 21, and a hardmask layer 24 on insulating layer 23. The structures may include a first structure 20 of a first type device, as shown in FIG. 2A. First structure 20 includes a first trench 22 adjacent to first structure 20. For example, the insulating layer may include silicon dioxide, and the hardmask layer may include silicon nitride. In some embodiments, the first structure may be used to form a device that has a relatively high operating voltage (alternatively referred to as a high-voltage device), e.g., a P-channel high-voltage device or an N-channel high-voltage device.

The substrate structure may be formed using the following steps: forming an insulating layer (e.g., silicon dioxide) on a semiconductor substrate (e.g., a silicon substrate), forming a hardmask layer (e.g., silicon nitride) on the insulating layer, then performing an etching process to form the trenches to form the substrate structure, as shown in FIG. 2A. The active region may be used as a well region. For example, an ion implantation is performed into the semiconductor substrate to form a well region, and performing an annealing process on the well region.

Figure 2B:
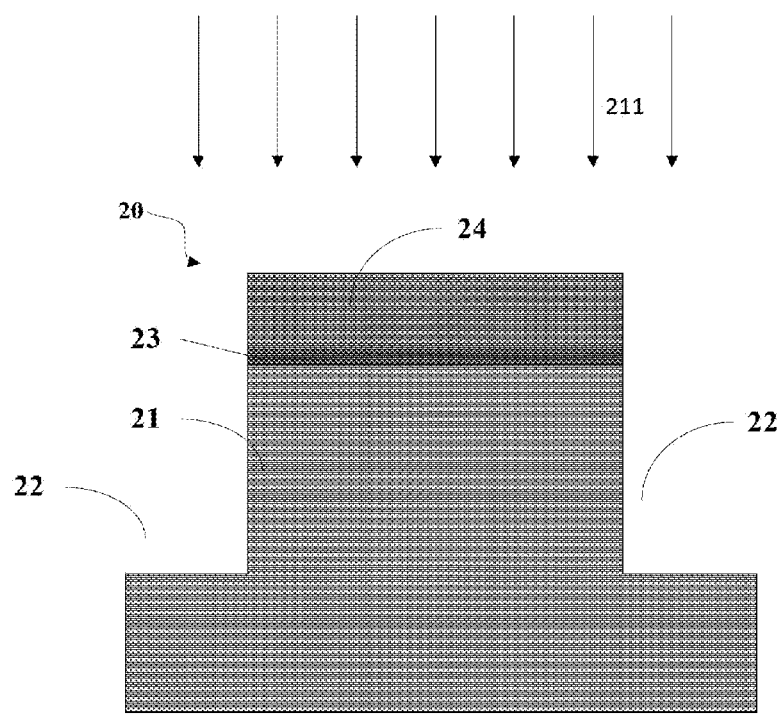
FIG. 2B is a cross-sectional view showing an intermediate structure for describing a manufacturing method of a semiconductor device according to some embodiments of the present disclosure.

Step S12: performing a first ion implantation process into the first structure. FIG. 2B shows that a first ion implantation process (indicated by arrows 211) is performed into the first structure 20.

In some embodiments, first structure 20 may be implanted with an N-type dopant of phosphorus or arsenic, with an implantation energy of 100 keV to 700 keV, and an implantation dose of $1 \times 10^{12}$ to $8 \times 10^{12}$ atoms/cm$^2$.

In other embodiments, first structure 20 may be implanted with a P-type dopant of boron, with an implantation energy of 60 keV to 300 keV, and an implantation dose of $1\times10^{12}$ to $8\times10^{12}$ atoms/cm$^2$.

The first ion implantation process may implant dopants into a drift region as a source or drain region of a high-voltage device. In some embodiments, for implanting a dopant into a high-voltage drift region, when the active region is an N-type well region, the dopant may be a P-type dopant; when the active region is a P-type well region, the dopant may be an N-type dopant. That is, the implantation dose, the implantation energy and other parameters may be determined according to actual requirements, for example, the first ion implantation may be performed once or multiple times with different implantation energies.

Since the implantation energy is relatively high, the implanted depth in the substrate at the bottom of the trenches is relatively deep. However, the depth of the dopant profile in the trenches is not relevant to the present disclosure.

Figure 2C:
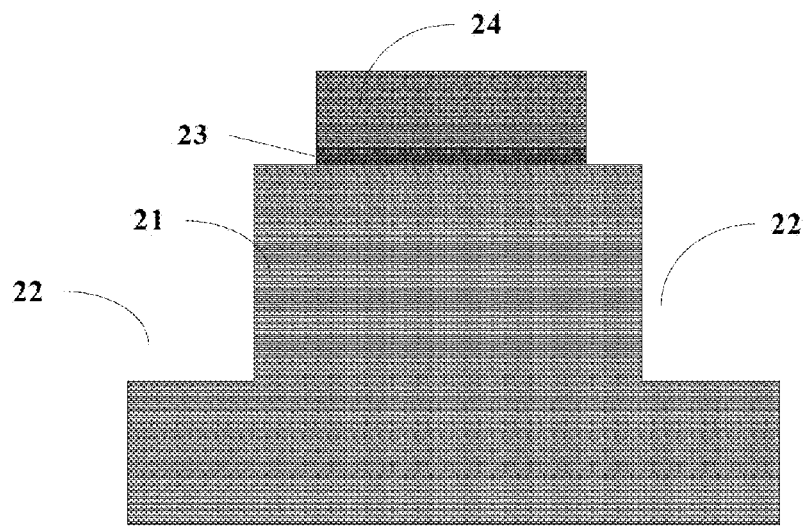
FIG. 2C is a cross-sectional view showing an intermediate structure for describing a manufacturing method of a semiconductor device according to some embodiments of the present disclosure.

Step S13: performing an etching (pull-back) process on the hardmask layer and on the insulating layer to pull back the hardmask layer and the insulating layer and expose a corner portion of the active region. As shown in FIG. 2C, the hardmask layer and the insulating layer are pulled back (e.g., using an etching process) to form a pulled back hardmask layer 24 and a pulled back dielectric layer 23.

For example, a portion of the hardmask layer and the insulating layer can be removed by etched using a wet etching process including an etching solution containing phosphoric acid. The etching solution may react with silicon nitride (e.g., the hardmask layer) so silicon nitride is etched. The etching solution has a sufficient high selectivity for silicon oxide and silicon nitride, but the etching solution does not react with the silicon. The silicon nitride layer is generally more compact, but after the first ion implantation at step S11, the silicon nitride layer becomes less compact. Thus, by performing the pull-back (etching) process, the etching rate may be increased, and the silicon nitride layer as the hardmask layer can be more readily etched.

In some other embodiments, the pull-back process can be performed separately for the hardmask layer and for the insulating layer. For example, the hardmask layer is first etched with phosphoric acid, then the insulating layer is etched with hydrofluoric acid. In another example, the insulating layer is first etched with hydrofluoric acid, and the hardmask layer is then etched with phosphoric acid.

Figure 2D:
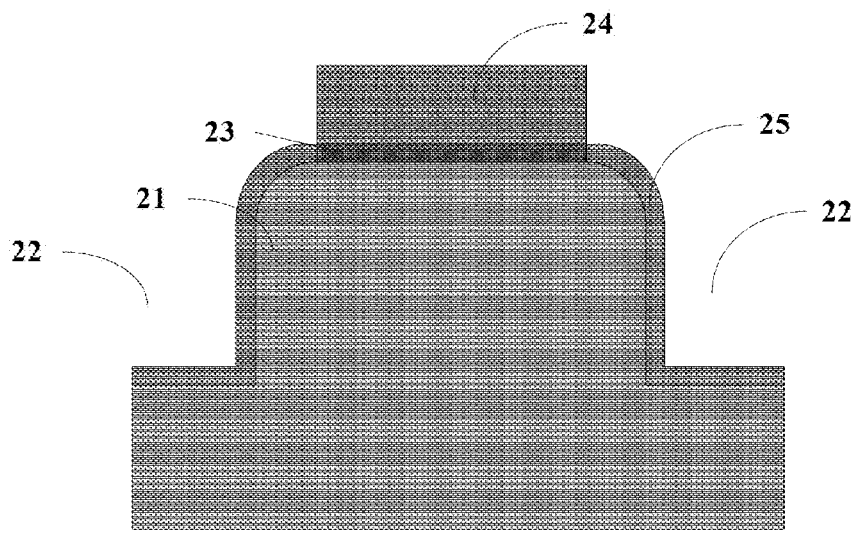
FIG. 2D is a cross-sectional view showing an intermediate structure for describing a manufacturing method of a semiconductor device according to some embodiments of the present disclosure.

Step S14: performing a rounding process on the exposed corner portion of the active region. In some embodiments the exposed corner portion of the active region is oxidized in the rounding process, and an oxide layer (e.g., a pad oxide layer) 25 is formed on the exposed corner portion, on the bottom and on sidewalls of the trenches, as shown in FIG. 2D. That is, oxide layer 25 is formed using an oxidation process on the exposed corner portion and on the bottom and sidewalls of the trenches. In the oxidation process, the active region material (e.g., silicon) of the corner portion is oxidized. As a result, the corner portion of the active region is rounded.

Further, since the hardmask layer (and thus the insulating layer) is etched more easily in the previous step, e.g., the hardmask layer in the high-voltage device region (relatively to the low-voltage region) has been implanted with dopants, it can be etched more quickly by the wet etching process to expose more of the corner portion of the active region beneath it. That is, the corner portion can be formed to have a larger curvature radius, so that the corner portion becomes more rounded.

It should be noted that the drawings are merely used to schematically illustrate the present disclosure, but are not limited to the shape, size or aspect ratio.

Thus, embodiments of the present disclosure provide a method for manufacturing a semiconductor device. Those of skill in the art will appreciate that embodiments of the present invention also provide a corresponding semiconductor device having a rounded corner portion in an active region. Thus, the corner portion of the active region may have a thicker oxide layer to improve the reliability of the device. Further, because the corner portion is chamfered, the curvature radius of the corner portion increases, so that the electric field concentration at the corner portion is reduced, thereby improving the reliability of the semiconductor device.

Figure 2E:
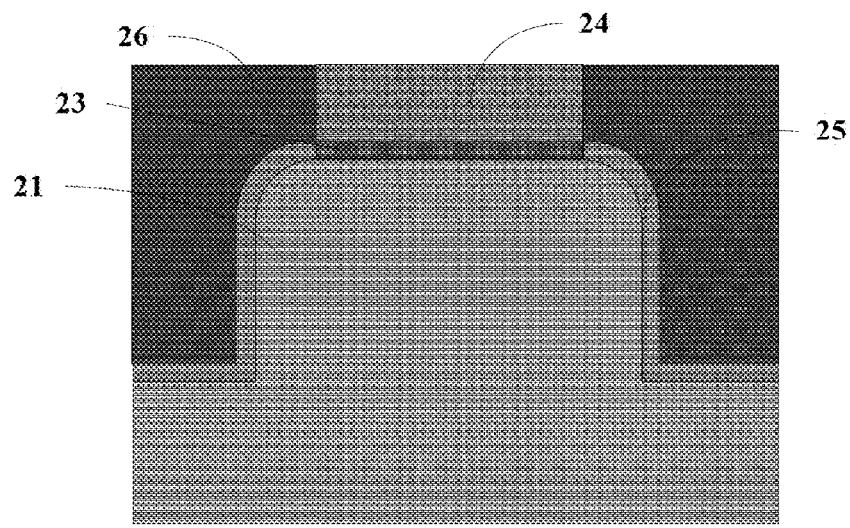
FIG. 2E is a cross-sectional view showing an intermediate structure for describing a manufacturing method of a semiconductor device according to some embodiments of the present disclosure.

In some embodiments, method 100 may further include, after rounding the corner portion of the active region, filling the trenches with an insulating material, as shown in FIG. 2E. For example, an insulating material (e.g., silicon dioxide) 26 may be deposited on the structure shown in FIG. 2D, then a planarization (e.g., a chemical mechanical polishing) process is performed on the insulating material until the hardmask layer is exposed, as shown in FIG. 2E.

Figure 2F:
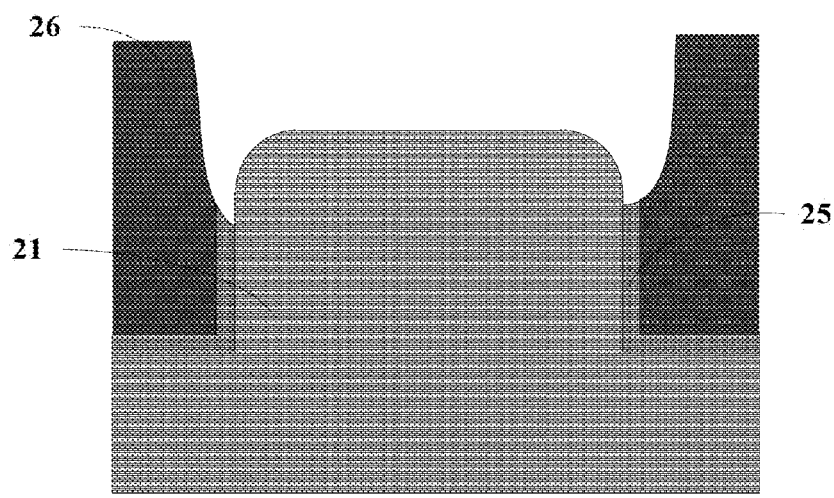
FIG. 2F is a cross-sectional view showing an intermediate structure for describing a manufacturing method of a semiconductor device according to some embodiments of the present disclosure.

In some embodiments, after filling the trenches, method 100 may also include removing the hardmask layer and the insulating layer to expose the active region, and forming a gate structure on the exposed active region. For example, as shown in FIG. 2F, hardmask layer 23 and insulating layer 23 are removed to expose active region 21 for subsequent processing. In some embodiments, a portion of insulating material 26 is also removed with the removal of the hardmask layer and the insulating layer, as shown in FIG. 2F.

Figure 2G:
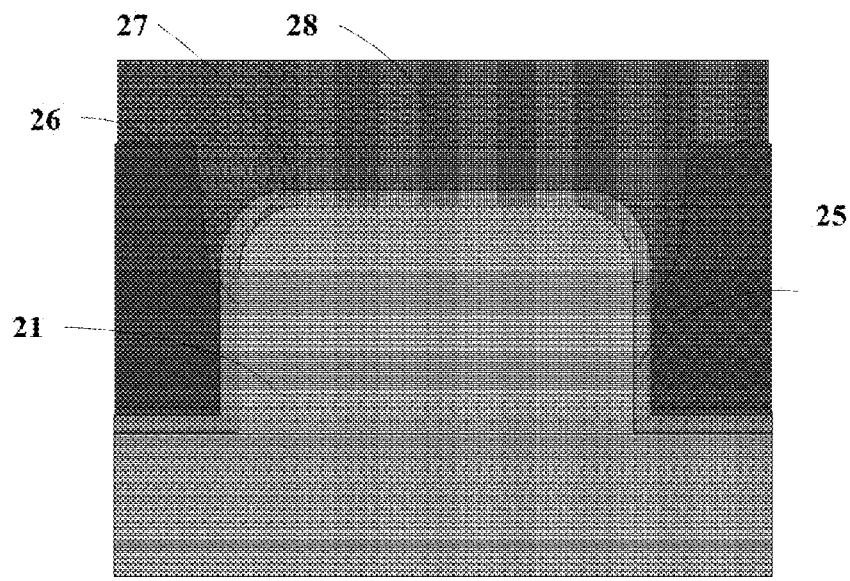
FIG. 2G is a cross-sectional view showing an intermediate structure for describing a manufacturing method of a semiconductor device according to some embodiments of the present disclosure.

In some embodiments, a gate structure is formed on the exposed active region 21, as shown in FIG. 2G. The gate structure may include a gate insulating layer 27 and a gate 28. In an exemplary embodiment, after forming a gate insulating layer by oxidation or deposition on the exposed active region, and after forming a gate layer by oxidation or deposition on the gate insulating layer, the gate layer and the gate insulating layer are patterned to form a gate structure. In some embodiments, the gate insulating layer may include silicon oxide, and the gate layer may include polysilicon, copper, or aluminum.

Thus, embodiments of the present disclosure provide a method for manufacturing a semiconductor device. Embodiments of the present disclosure also provide a semiconductor device having a more rounded corner portion of the active region. Thus, on the one hand, a thicker oxide layer may be formed on the more rounded corner portion of the active region to improve the reliability of the device. On the other hand, due to the chamfered corner portion of the active region, the curvature radius of the corner portion increases, thereby reducing the electric field concentration at the corner portion and improving the reliability of the semiconductor device. Those of skill in the art will appreciate that FIG. 2G illustrates the cross-sectional view of the rounded corner portion of the active region in the transverse direction, the corner portion of the active region is also rounded along a vertical direction perpendicular to the transverse direction (not shown).

In subsequent process steps, method 100 may also include a self-aligned source/drain ion implantation process to form a source and drain region. For example, the source and drain regions may be disposed on opposite sides of the gate and in front and behind the drawing plane of FIG. 2G. Commonly known processes of forming source and drain regions will not be described herein for the sake of brevity.

In some embodiments, after the pull-back process of the hardmask layer and the insulating layer, method 100 may further include performing a second ion implantation into at least a portion of the first trenches adjacent to the first structure to form a first doped region in the substrate at the bottom of the first trenches. In a preferred embodiment, the energy of the second ion implantation is less than the energy of the first ion implantation.

FIGS. 3A through 3F are cross-sectional views of intermediate structures for describing a method for manufacturing a semiconductor device according to some other embodiments of the present disclosure.

Figure 3A:
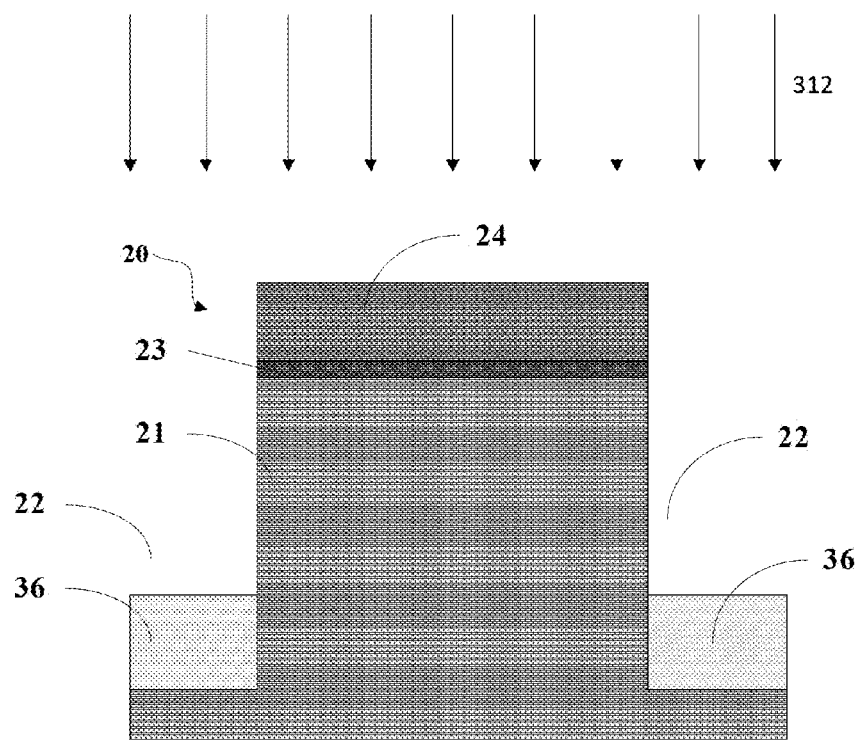
FIG. 3A is a cross-sectional view showing an intermediate structure for describing a manufacturing method of a semiconductor device according to other embodiments of the present disclosure.

Referring to FIG. 3A, after step S11 and before step S13, a second ion implantation 312 is performed into at least a portion of the first trenches 22 adjacent to first structure 20 to form a first doped region 36 in the substrate in the bottom of first trenches 22. The energy of the second ion implantation is less than the energy of the first ion implantation.

The present inventors discovered that the depletion region in a well region may cause a punch-through between the doped region and adjacent well region of a opposite type dopant. Using the P-type well region (referred to as "PW") as an example, the depletion region of the PW may connect the N+ source/drain region of the PW to the adjacent N-type well region (referred to as NW), resulting in a punch-through, thereby forming a leakage path. Conversely, this effect also applies to the N-type well region as well. In particular, the operating voltage of the high-voltage device is relatively high, so that the depletion region is relatively wide and prone to punch-through. By forming a doped region in the substrate at the bottom of the trenches by performing the second ion implantation, the depletion width can be reduced. This electrical isolation approach can improve the isolation of the well region.

Since the hardmask layer is on the active region, when the second ion implantation is performed into the trenches, the energy of the second ion implantation can be controlled in the way that the dopants will not enter the hardmask layer, or the thickness of the hardmask layer can be increased dependent from the required implantation energy so that dopants of the second ion implantation do not enter the hardmask layer and affect the active region. In the embodiment, the presence of the hardmask layer does not require an additional reticle, thereby saving the lithography and other process steps and reducing manufacturing costs.

In some embodiments, the source material of the second ion implantation may include phosphorus or arsenic, the implantation energy may be in the range between 8 keV and 60 keV, and the implantation dose is in the range between $5 \times 10^{12}$ to $1 \times 10^{14}$ atoms/cm$^2$.

In some other embodiments, the source material of the second ion implantation may include boron or boron fluoride, the implantation energy may be in the range between 5 keV and 30 keV, and the implantation dose is in the range between $5 \times 10^{12}$ to $1 \times 10^{14}$ atoms/cm$^2$.

Those of skill in the art will appreciate that the source material of the second ion implantation may be an N-type or a P-type dopant depending from the required electrical isolation. A description will be provided further below in conjunction with FIGS. 4A-4J.

Figure 3B:
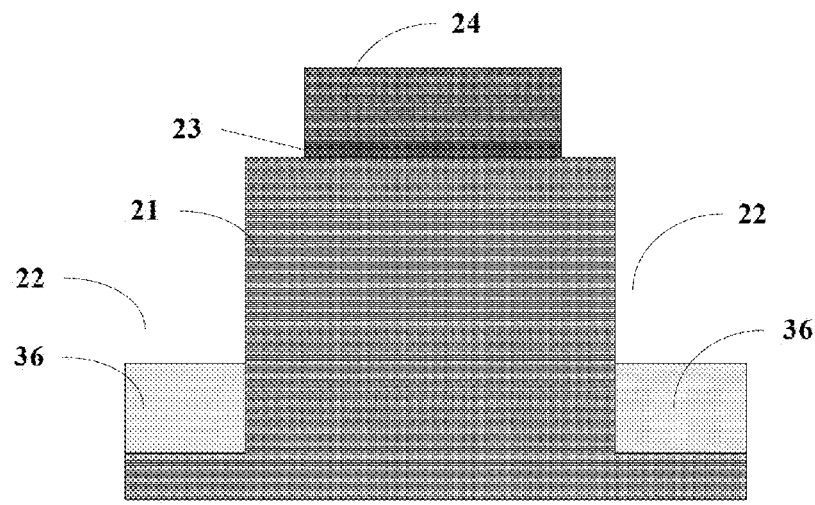
FIG. 3B is a cross-sectional view showing an intermediate structure for describing a manufacturing method of a semiconductor device according to other embodiments of the present disclosure.

Next, referring to FIG. 3B, a pull-back process is performed on hardmask layer 24 and on insulating layer 23 to pull back the hardmask layer and the insulating layer and expose a corner portion of active region 21.

Figure 3C:
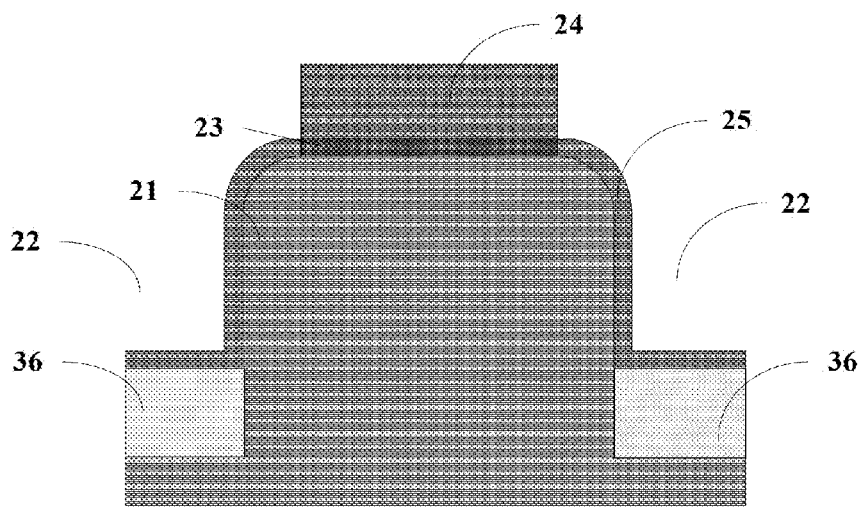
FIG. 3C is a cross-sectional view showing an intermediate structure for describing a manufacturing method of a semiconductor device according to other embodiments of the present disclosure.

Next, referring to FIG. 3C, a rounding process is performed on the exposed corner portion of the active region to form an oxide layer 25 on the exposed corner portion of the active region and on the bottom and on sidewalls of the trenches.

Figure 3D:
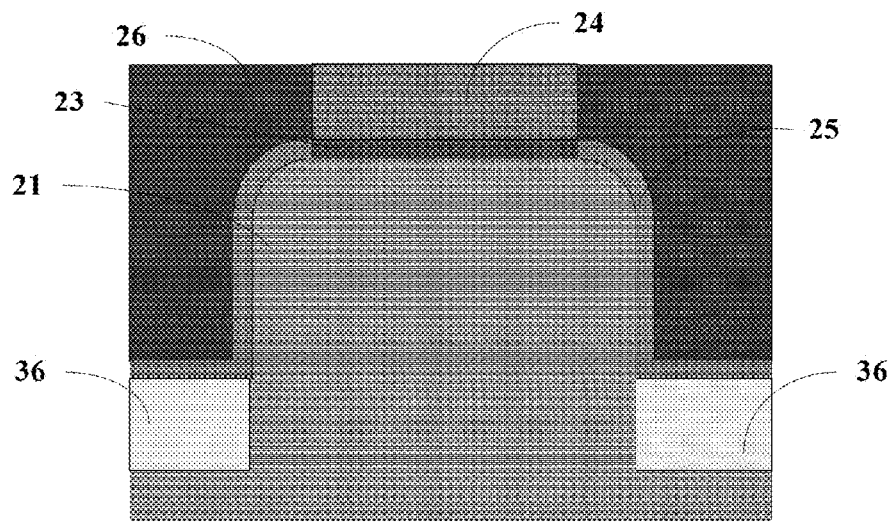
FIG. 3D is a cross-sectional view showing an intermediate structure for describing a manufacturing method of a semiconductor device according to other embodiments of the present disclosure.

Next, referring to FIG. 3D, the trenches are filled with an insulating material 26.

Figure 3E:
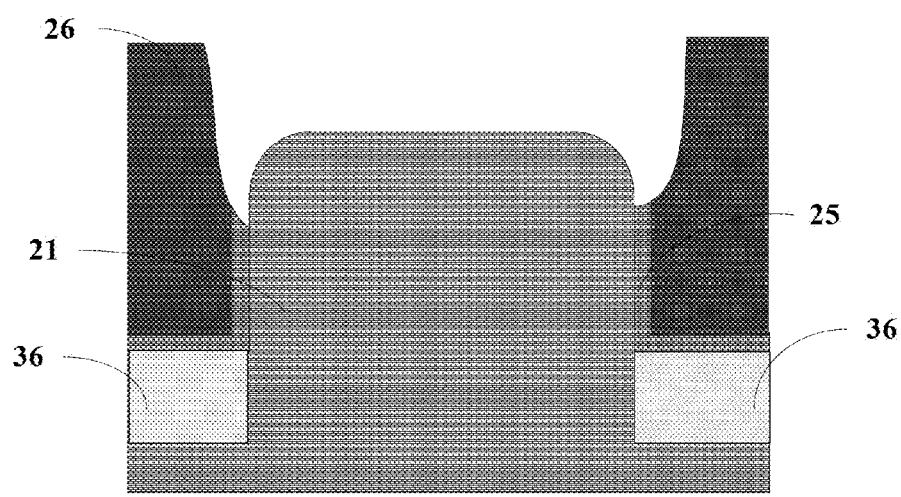
FIG. 3E is a cross-sectional view showing an intermediate structure for describing a manufacturing method of a semiconductor device according to other embodiments of the present disclosure.

Next, referring to FIG. 3E, hardmask layer 24 and insulating layer 23 are removed to exposed a surface of active region 21.

Figure 3F:
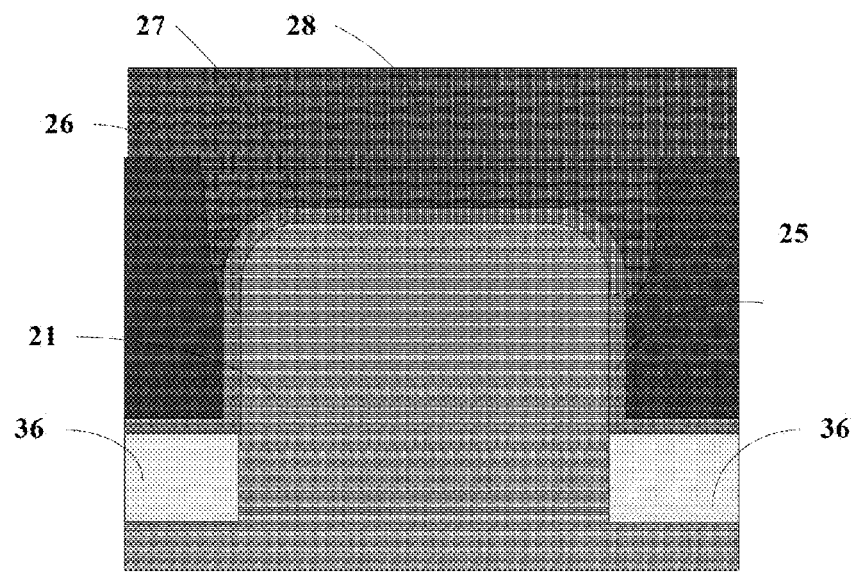
FIG. 3F is a cross-sectional view showing an intermediate structure for describing a manufacturing method of a semiconductor device according to other embodiments of the present disclosure.

Next, referring to FIG. 3F, a gate structure is formed on active region 21. The gate structure includes a gate insulating layer 27 and a gate 28.

In some embodiments, the substrate structure may also include a second structure configured to form a second type device. Prior to performing the first ion implantation, the method may include forming a first barrier layer on the second structure.

In some embodiments, the second structure configured to form a second type device is formed on the substrate. The method may include, prior to performing the first ion implantation, forming a first barrier layer on the second structure, and after performing the second ion implantation into a portion of the first trenches adjacent to the first structure and prior to performing the pull-back process, removing the first barrier layer from the second structure.

In some embodiments, after removing the first barrier layer from the second structure, the method may also include forming a second barrier layer covering the first structure and exposing the second structure, and performing a third ion implantation into the second structure.

In some embodiments, the method may further include performing a fourth ion implantation into a portion of the second trenches adjacent to the second structure to form a second doped region in the substrate at the bottom of the second trenches, the implantation energy of the fourth implantation is less than the implantation energy of the third implantation.

Thus, there is provided a method for manufacturing a semiconductor device according to some other embodiments of the present disclosure. In accordance with some embodiments of the present disclosure, because the first doped region is formed in the trenches, an electrically isolation is thus formed in the trenches, which improves the isolation effect of the well region.

FIGS. 4A through 4J are cross-sectional views of intermediate structures for describing a method for manufacturing a semiconductor device according to still some other embodiments of the present disclosure.

Figure 4A:
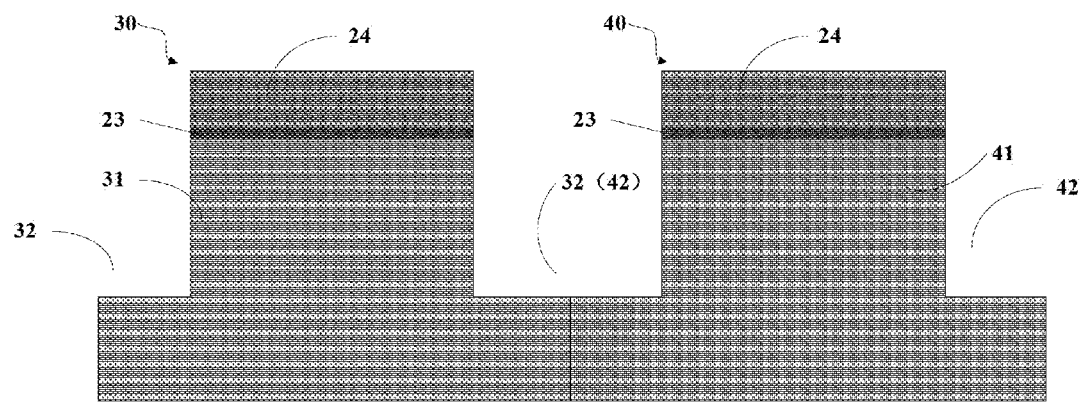
FIG. 4A is a cross-sectional view showing an intermediate structure for describing a manufacturing method of a semiconductor device according to yet other embodiments of the present disclosure.
Figure 4B:
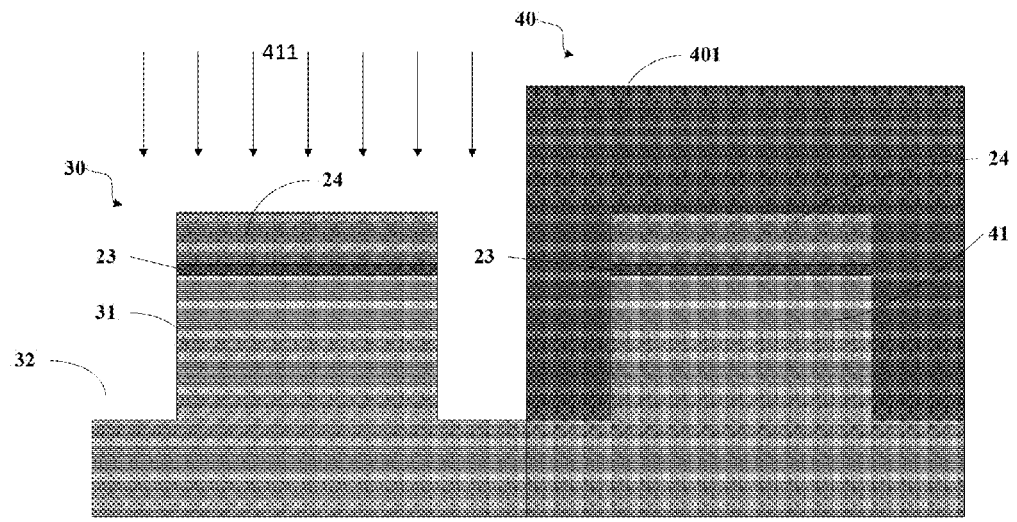
FIG. 4B is a cross-sectional view showing an intermediate structure for describing a manufacturing method of a semiconductor device according to yet other embodiments of the present disclosure.

Referring to FIG. 4A, a substrate structure is provided. The substrate structure includes a substrate having a first structure 30 for forming a first type device and a second structure 40 for forming a second type device. First structure 30 includes a first active region 31 that is isolated by trenches, an insulating layer 23 on first active region 31, and a hardmask layer 24 on insulating layer 23. Second structure 40 includes a second active region 41 that is isolated by trenches, an insulating layer 23 on second active region 41, and hardmask layer 24 on insulating layer 23. The trenches include first trenches 32 adjacent to first structure 30 and second trenches 42 adjacent to second structure 40. The trench located between first structure 30 and second structure 40 is denoted trench 32 (42). For example, the first structure may be used to form an N-channel high-voltage device, and the second structure may be used to form a P-type high-voltage device. Alternatively, the first structure may be used to form a P-channel high-voltage device, and the second structure may be used to form an N-type high-voltage device Next, referring to FIG. 4B, a first barrier layer (e.g., a photoresist) 401 is formed on second structure 40 exposing first structure 30. A first ion implantation 411 is performed into first structure 30. In certain embodiments, first barrier layer 401 may cover a portion of the second trenches adjacent the second structure.

Figure 4C:
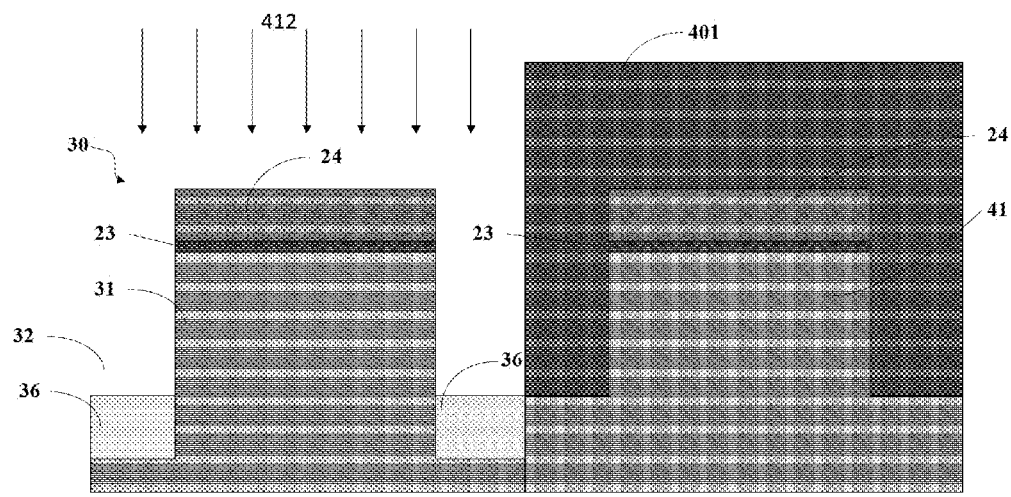
FIG. 4C is a cross-sectional view showing an intermediate structure for describing a manufacturing method of a semiconductor device according to yet other embodiments of the present disclosure.

Next, referring to FIG. 4C, a second ion implantation 412 is performed into first trench 32 adjacent to structure 30 to form a first doped region 36 in the substrate at the bottom of first trench 32. For example, first doped region 36 has a first conductivity type. In a specific embodiment, the first conductivity type of first doped region 36 is P-type (e.g., an N-channel device is formed in a P-type well region).

Figure 4D:
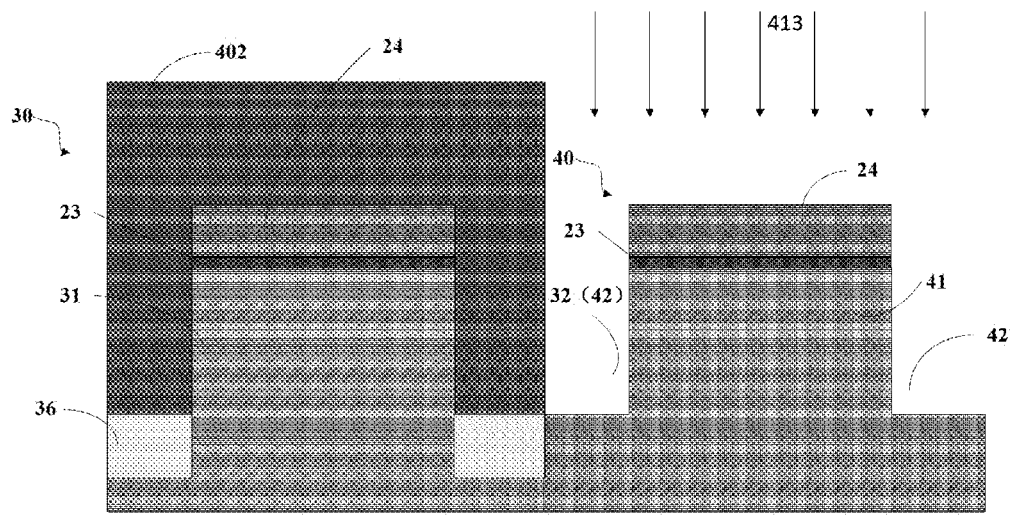
FIG. 4D is a cross-sectional view showing an intermediate structure for describing a manufacturing method of a semiconductor device according to yet other embodiments of the present disclosure.

Next, referring to FIG. 4D, first barrier layer 401 is removed, a second barrier layer 402 is formed on first structure 30 exposing second structure 40. A third ion implantation 413 is performed into second structure 40.

In certain embodiments, the source material of the third ion implantation may include phosphorus or arsenic, the third ion implantation is performed with an implantation energy of 100 keV to 700 keV, and an implantation dose of $1 \times 10^{12}$ to $8 \times 10^{12}$ atoms/cm$^2$. For example, for a P-type well region, where a high-voltage N-channel device is formed, the third ion implantation may include an N-type dopant for forming the source and drain regions.

In other embodiments, the source material of the third ion implantation may include a P-type dopant such as a boron containing dopant. The third ion implantation is performed with an implantation energy of 60 keV to 300 keV, and an implantation dose of $1 \times 10^{12}$ to $8 \times 10^{12}$ atoms/cm$^2$. For example, for an N-type well region, where a high-voltage P-channel device is formed, the third ion implantation may include a P-type dopant for forming the source and drain regions.

In the embodiment, the third ion implantation is similar to the first ion implantation, so that hardmask layer 24 on second active region 41 can be more easily etched in the subsequent pull-back process to expose more of the corner portion of second active region 41, thereby facilitating the rounding process of the corner portion.

Figure 4E:
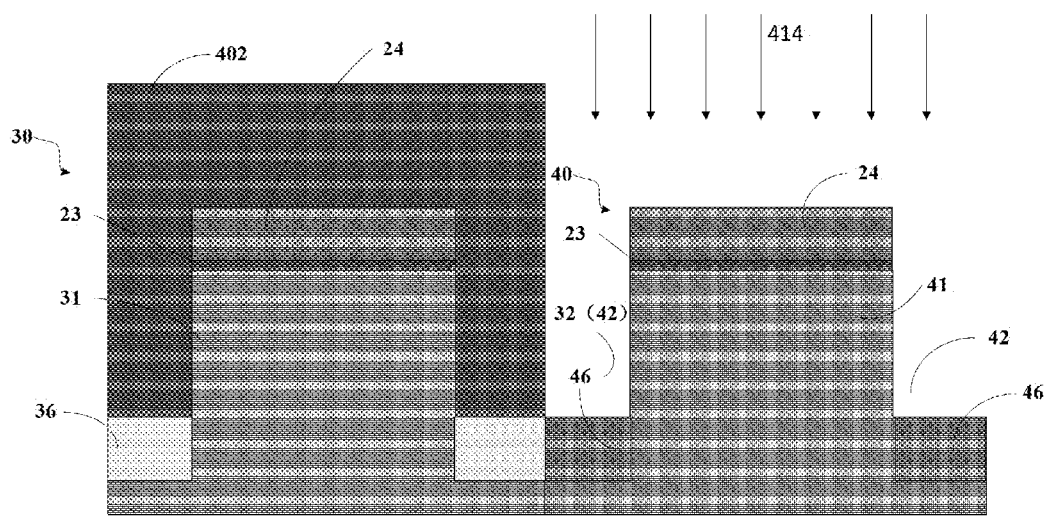
FIG. 4E is a cross-sectional view showing an intermediate structure for describing a manufacturing method of a semiconductor device according to yet other embodiments of the present disclosure.

Next, referring to FIG. 4E, a fourth ion implantation 414 is performed into second trenches 42 adjacent second structure 40 to form a second doped region 46 in the substrate at the bottom of second trenches 42. The implantation energy of the fourth ion implantation is lower than the implantation energy of the third ion implantation. Second barrier layer 402 is then removed.

In some embodiments, the source material of the fourth ion implantation may include phosphorus or arsenic, the implantation energy may be in the range between 8 keV and 60 keV, and the implantation dose is in the range between $5 \times 10^{12}$ to $1 \times 10^{14}$ atoms/cm$^2$.

In some other embodiments, the source material of the fourth ion implantation may include boron or boron fluoride, the implantation energy may be in the range between 5 keV and 30 keV, and the implantation dose is in the range between $5 \times 10^{12}$ to $1 \times 10^{14}$ atoms/cm$^2$.

In one example embodiment, for an N-type well region, where a high-voltage P-channel device is formed, the conductivity type of second doped region 46 is preferably N-type. In another example embodiment, for a P-type well region, where a high-voltage N-channel device is formed, the conductivity type of second doped region 46 is preferably P-type.

Here, the fourth ion implantation is similar to the second ion implantation. In embodiments of the present disclosure, for a P-type well region, the dopants of the fourth ion implantation or the second ion implantation are preferably P-type dopants. For an N-type well region, the dopants of the fourth ion implantation or the second ion implantation are preferably N-type dopants. However, the types of dopants may be chosen according to the doped region. The fourth ion implantation forms an electrical isolation in the trenches, thereby improving the isolation of the well region.

Figure 4F:
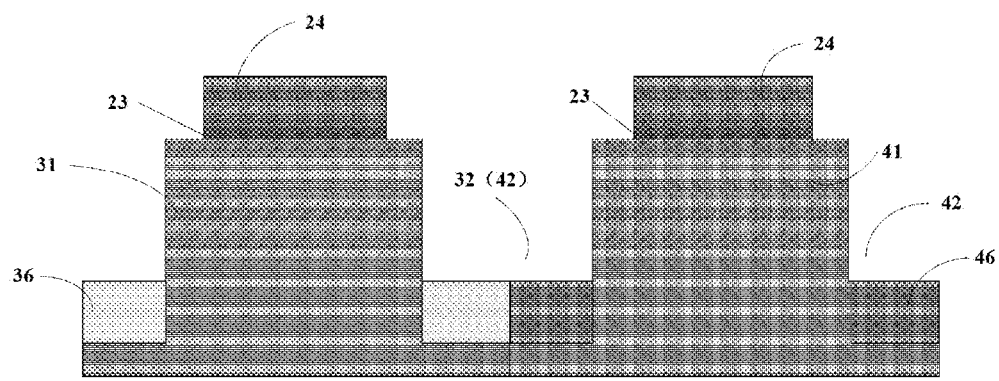
FIG. 4F is a cross-sectional view showing an intermediate structure for describing a manufacturing method of a semiconductor device according to yet other embodiments of the present disclosure.

Next, referring to FIG. 4F, a pull-back process is performed on hardmask layer 24 and on insulating layer 23 to form a pulled back hardmask layer 24 and a pulled back insulating layer 23 and expose a corner portion of active region 31 and a corner portion of active region 41.

Figure 4G:
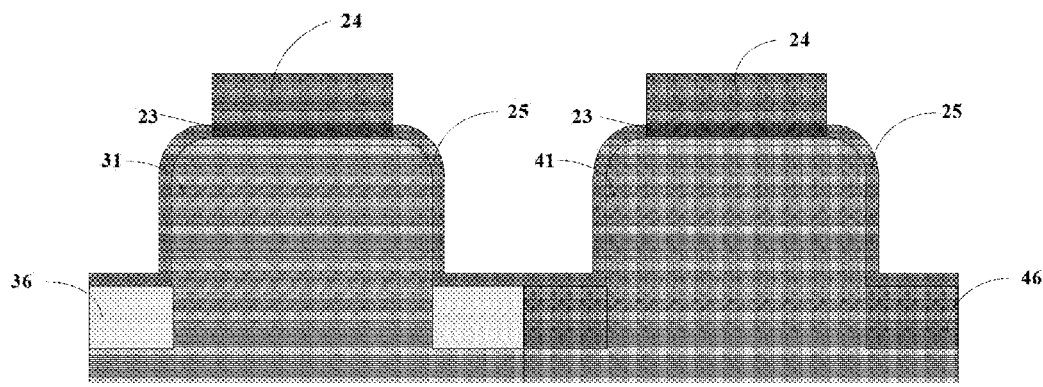
FIG. 4G is a cross-sectional view showing an intermediate structure for describing a manufacturing method of a semiconductor device according to yet other embodiments of the present disclosure.

Next, referring to FIG. 4G, a rounding process is performed on the exposed corner portions of the active regions, and an oxide layer 25 is formed on the exposed corner portions, on the bottom and on sidewalls of the trenches.

Figure 4H:
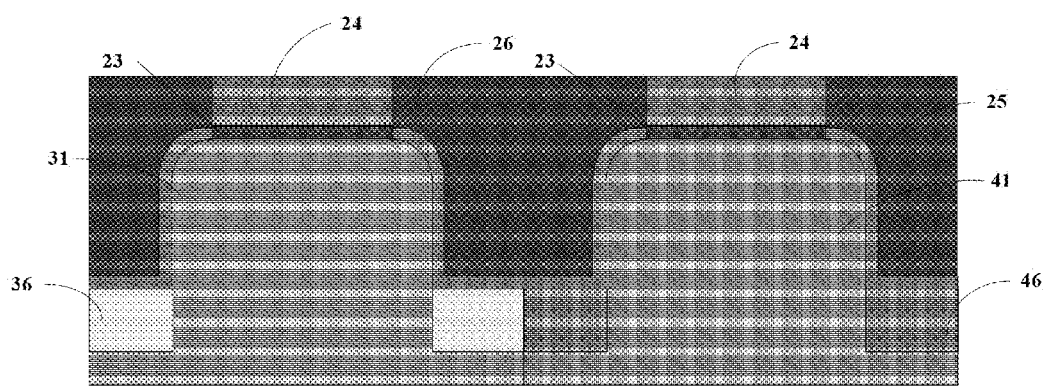
FIG. 4H is a cross-sectional view showing an intermediate structure for describing a manufacturing method of a semiconductor device according to yet other embodiments of the present disclosure.

Next, referring to FIG. 4H, the trenches are filled with an insulating material 26. In some embodiments, the insulating material is formed on the structure as shown in FIG. 4G. Thereafter, a planarization (e.g., CMP) process is performed on the insulating material.

Figure 4I:
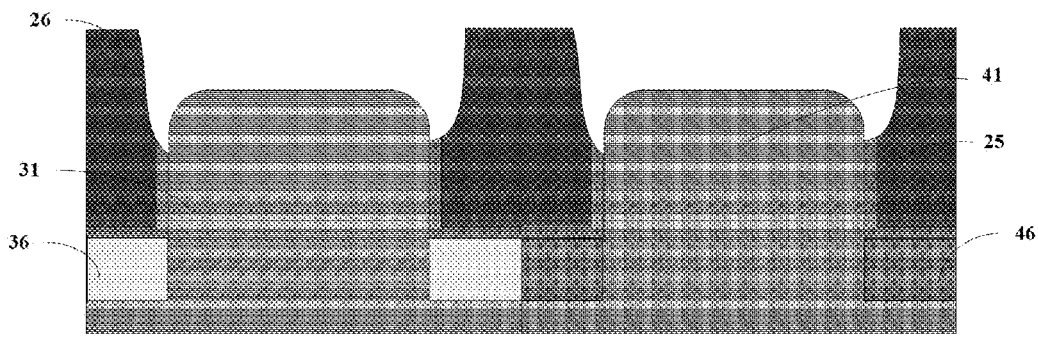
FIG. 4I is a cross-sectional view showing an intermediate structure for describing a manufacturing method of a semiconductor device according to yet other embodiments of the present disclosure.

Next, referring to FIG. 4I, hard mask layer 24 and insulating layer 23 are removed to expose first active region 31 and second active region 41.

Figure 4J:
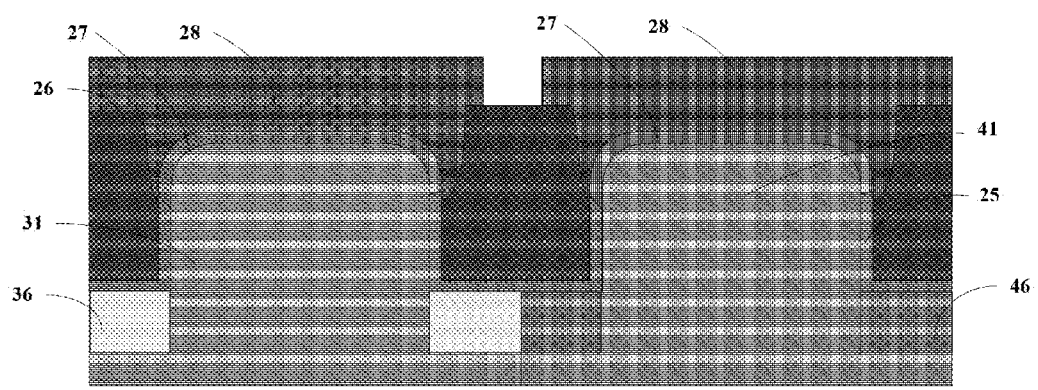
FIG. 4J is a cross-sectional view showing an intermediate structure for describing a manufacturing method of a semiconductor device according to yet other embodiments of the present disclosure.

Next, referring to FIG. 4J, a gate structure is formed on active region 31 and second active region 41. The gate structure includes insulating material 27 and gate 28.

Thus, embodiments of the present disclosure provide another method for manufacturing a semiconductor device. The thus manufactured semiconductor device includes two devices, for example, a high-voltage N-channel device, and a high-voltage P-channel device. In the embodiment, the pull-back process is concurrently performed on the hardmask layer and the insulating layer of the first and second structures, and the subsequent processes, e.g., forming the gate structure on the first and second active regions, are also concurrently performed.

In some other embodiments, the pull-back process may not be concurrently performed on the hardmask layer and the insulating layer of the first and second structures. For example, the second ion implantation may be performed into the first structure with the first barrier layer covering the second structure, the pull-back process is performed on the hardmask of the first structure. Thereafter, the fourth ion implantation is performed into the second structure with the second barrier layer covering the first structure, and the pull-back process is performed on the hardmask of the second structure. The present invention is not limited to the described process steps.

In some embodiments, the substrate may further include a third structure configured to form a third type device. The third type device can be operating at a voltage lower than the operating voltage of the first type device. The first barrier layer can also be formed on the third structure. The second barrier layer can also be formed on the third structure.

FIGS. 5A through 5J are cross-sectional views of intermediate structures for describing a method for manufacturing a semiconductor device according to still some other embodiments of the present disclosure.

Figure 5A:
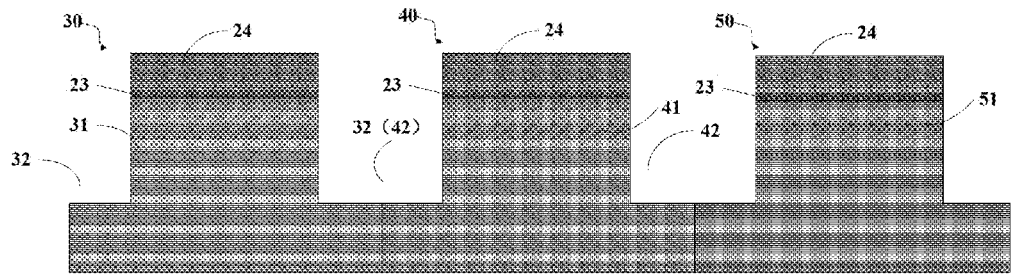
FIG. 5A is a cross-sectional view showing an intermediate structure for describing a manufacturing method of a semiconductor device according to still other embodiments of the present disclosure.

Referring to FIG. 5A, a substrate structure is provided. The substrate structure include a first structure 30 for forming a first type device, a second structure 40 for forming a second type device, and a third structure 50 for forming a third type device. The third type device has an operating voltage that is lower than the operating voltage of the first type device. First structure 30 includes a first active region 31 that is isolated by trenches, an insulating layer 23 on first active region 31, and a hardmask layer 24 on insulating layer 23. Second structure 40 includes a second active region 41 that is isolated by trenches, an insulating layer 23 on second active region 41, and hardmask layer 24 on insulating layer 23. Third structure 50 includes a third active region 51 that is isolated by trenches, an insulating layer 23 on second active region 41, and hardmask layer 24 on insulating layer 23. The trenches include first trenches 32 adjacent to first structure 30 and second trenches 42 adjacent to second structure 40. The trench located between first structure 30 and second structure 40 is denoted trench 32 (42). For example, the first structure may be used to form a high-voltage N-channel device, and the second structure may be used to form a high-voltage P-channel device. Alternatively, the first structure may be used to form a P-channel high-voltage device, the second structure may be used to form an N-type high-voltage device, and the third structure may be used to form a low-voltage device.

Figure 5B:
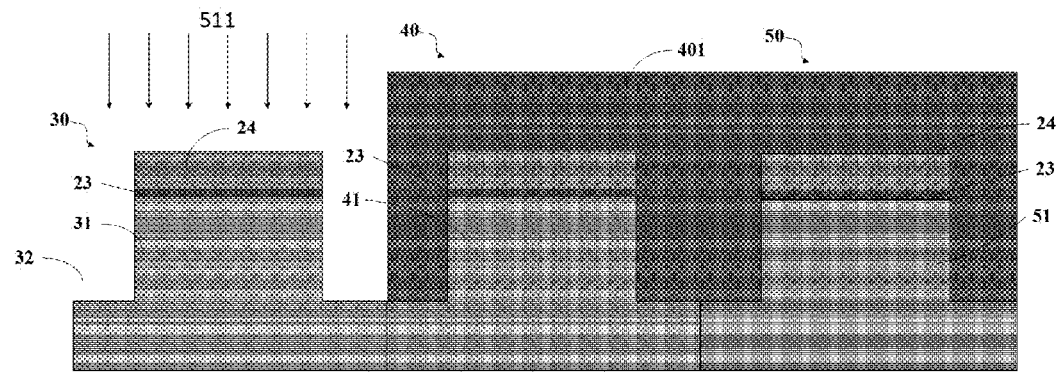
FIG. 5B is a cross-sectional view showing an intermediate structure for describing a manufacturing method of a semiconductor device according to still other embodiments of the present disclosure.

Next, referring to FIG. 5B, a first barrier layer (e.g., a photoresist) 401 is formed on second structure 40 exposing first structure 30, the first barrier layer is also formed on third structure 50. A first ion implantation 511 is performed into first structure 30. In certain embodiments, first barrier layer 401 may cover a portion of the second trenches adjacent the second structure.

Figure 5C:
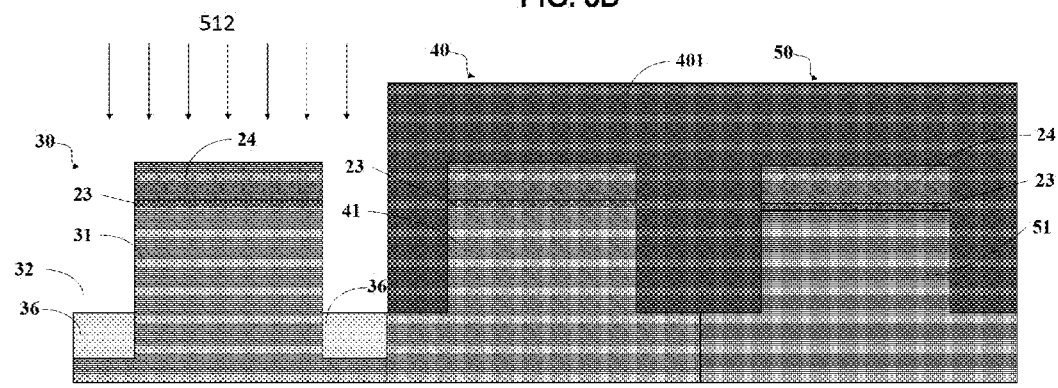
FIG. 5C is a cross-sectional view showing an intermediate structure for describing a manufacturing method of a semiconductor device according to still other embodiments of the present disclosure.

Next, referring to FIG. 5C, a second ion implantation 512 is performed into first trench 32 adjacent to structure 30 to form a first doped region 36 in the substrate at the bottom of first trench 32.

Figure 5D:
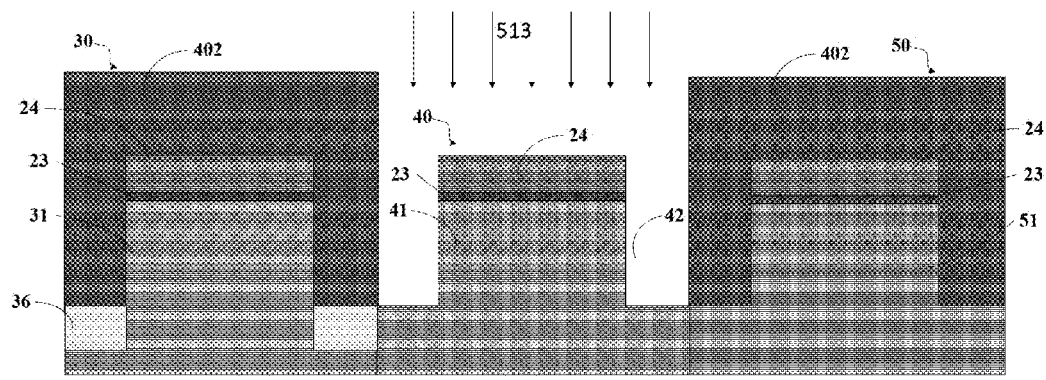
FIG. 5D is a cross-sectional view showing an intermediate structure for describing a manufacturing method of a semiconductor device according to still other embodiments of the present disclosure.

Next, referring to FIG. 5D, first barrier layer 401 is removed, a second barrier layer 402 (e.g., a photoresist) is formed on first structure 30 exposing second structure 40, the second barrier layer is also formed on third structure 50. A third ion implantation 513 is performed into second structure 40.

Figure 5E:
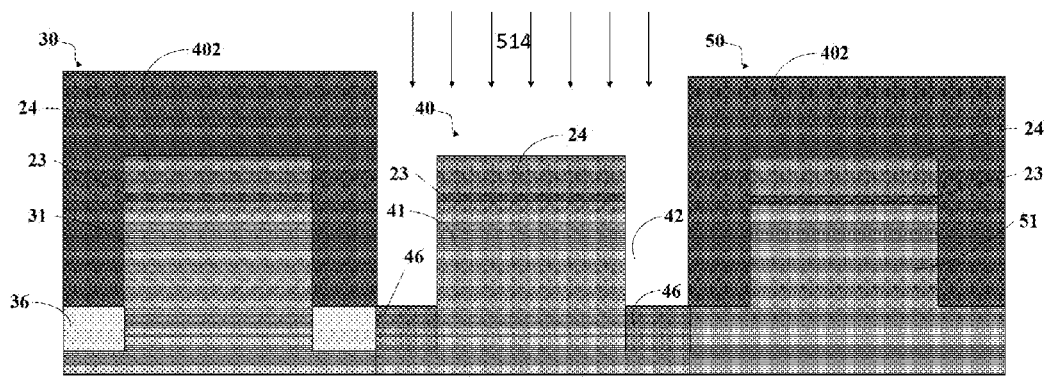
FIG. 5E is a cross-sectional view showing an intermediate structure for describing a manufacturing method of a semiconductor device according to still other embodiments of the present disclosure.

Next, referring to FIG. 5E, a fourth ion implantation 514 is performed into second trenches 42 adjacent second structure 40 to form a second doped region 46 in the substrate at the bottom of second trenches 42. The implantation energy of the fourth ion implantation is lower than the implantation energy of the third ion implantation. Second barrier layer 402 is then removed.

Figure 5F:
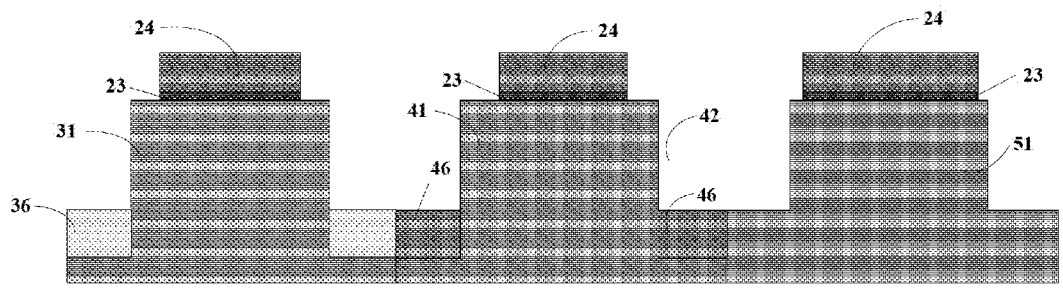
FIG. 5F is a cross-sectional view showing an intermediate structure for describing a manufacturing method of a semiconductor device according to still other embodiments of the present disclosure.

Next, referring to FIG. 5F, a pull-back process is performed on hardmask layer 24 and on insulating layer 23 to form a pulled back hardmask layer 24 and a pulled back insulating layer 23 exposing a corner portion of active region 31, a corner portion of active region 41, and a corner portion of active region 51. Herein, compared to the receding portion of the hardmask layer on the first structure or on the second structure, the receding portion of the hardmask layer on the third structure is smaller because the hardmask layer on the third structure has not been implanted with dopants.

Figure 5G:
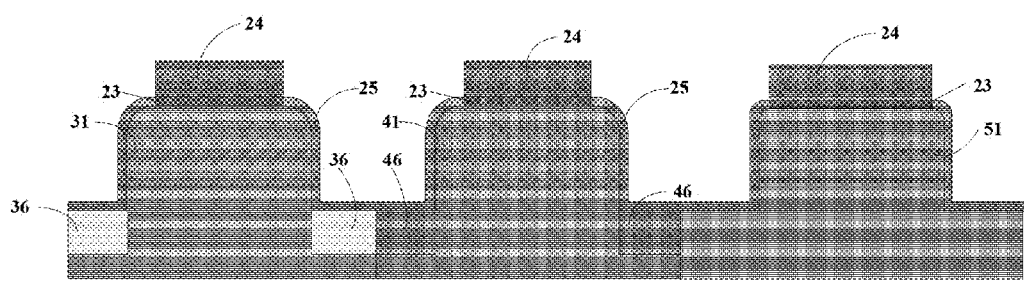
FIG. 5G is a cross-sectional view showing an intermediate structure for describing a manufacturing method of a semiconductor device according to still other embodiments of the present disclosure.

Next, referring to FIG. 5G, a rounding process is performed on the exposed corner portions of the active regions, and an oxide layer 25 is formed on the exposed corner portions, on the bottom and on sidewalls of the trenches.

Figure 5H:
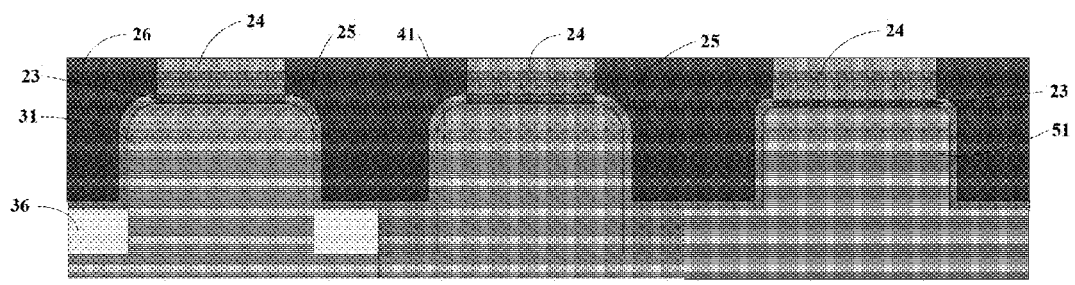
FIG. 5H is a cross-sectional view showing an intermediate structure for describing a manufacturing method of a semiconductor device according to still other embodiments of the present disclosure.

Next, referring to FIG. 5H, the trenches are filled with an insulating material 26. In some embodiments, the insulating material is formed on the structure as shown in FIG. 5G. Thereafter, a planarization (e.g., CMP) process is performed on the insulating material.

Figure 5I:
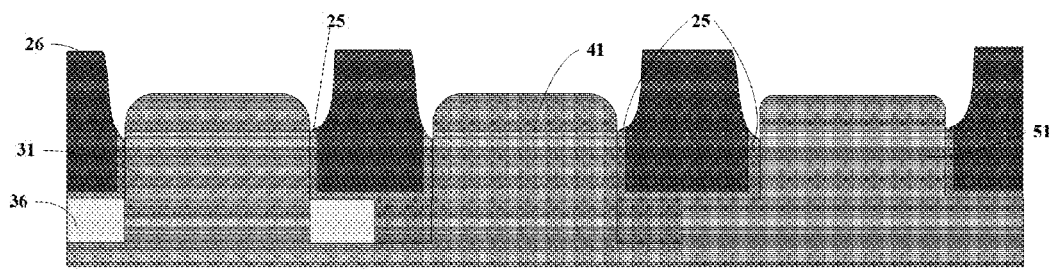
FIG. 5I is a cross-sectional view showing an intermediate structure for describing a manufacturing method of a semiconductor device according to still other embodiments of the present disclosure.

Next, referring to FIG. 5I, hard mask layer 24 and insulating layer 23 are removed to expose first active region 31, second active region 41, and third active region 51.

Figure 5J:
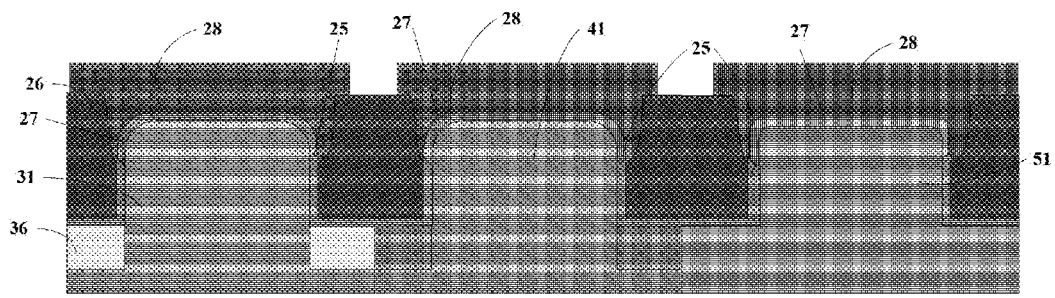
FIG. 5J is a cross-sectional view showing an intermediate structure for describing a manufacturing method of a semiconductor device according to still other embodiments of the present disclosure.

Next, referring to FIG. 5J, a gate structure is formed on active region 31, second active region 41, and active region 51. The gate structure includes insulating material 27 and gate 28.

Thus, embodiments of the present disclosure provide another method for manufacturing a semiconductor device. The thus manufactured semiconductor device includes three types of devices, for example, the first device is a high-voltage N-channel device, the second device is a high-voltage P-channel device, and the third device is a low-voltage device. In some embodiments, a semiconductor device may be manufactured according to the above-described method(s). The semiconductor device may include a high-voltage device (N-type or P-type), a medium-voltage device (N-type or P-type), and a low-voltage device (N-type or P-type). The high-voltage device includes an active region having a rounded corner portion fabricated according to one of the above-described methods, thus, the corner portion has a large curvature radius.

In the embodiment, the substrate structure includes a first structure for forming a first type device and a third structure for forming a third type device. In some embodiments of the manufacturing method, the hardmask layer of the third structure is not required to be receded as much as the hardmask layer of the first structure, so that a third barrier layer is formed on the third structure prior to performing the first ion implantation into the first structure. Then, the third barrier layer is removed after performing the second ion implantation on the first structure and prior to performing the pull-back process on the hardmask layer of the first structure.

In some embodiments, the substrate structure also includes a third structure for forming a third type device. The third type device has an operating voltage lower than an operating voltage of the first type device. The manufacturing method may include forming a third barrier layer on the third structure prior to performing the second ion implantation.

In the embodiment, the substrate structure includes a first structure for forming a first type device and a third structure for forming a third type device. In some embodiments of the manufacturing method, the hardmask layer of the third structure is required to receded more, but a doped region is not required to be formed in the trenches; the third barrier layer may thus be formed on the third structure after the first ion implantation and before the second ion implantation. Then, the third barrier layer is removed after the second ion implantation has been performed and before the pull-back process.

While the present disclosure is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present disclosure could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:
    providing a substrate structure including a substrate having a plurality of structures, each of the structures comprising an active region isolated by trenches, an insulating layer on the active region, and a hardmask layer on the insulating layer;
    performing a first ion implantation into a first structure configured to form a first type device;
    performing a pull-back process on the hardmask layer and on the insulating layer of the first structure to form a receded hardmask layer and a receded insulating layer and expose a corner portion of the active region; and
    performing a rounding process on the exposed corner portion,
    wherein performing the first ion implantation comprises:
    a source material including phosphorus or arsenic, an energy in a range between 100 keV and 700 keV, and a dose in a range between $1\times10^{12}$ and $8\times10^{12}$ atoms/cm$^2$; or
    a source material including boron, an energy in a range between 60 keV and 300 keV, and a dose in a range between $1\times10^{12}$ and $8\times10^{12}$ atoms/cm$^2$.

2. The method of claim 1, further comprising, prior to performing the pull-back process:
    performing a second ion implantation into a first trench adjacent to the first structure to form a first doped region in the substrate at a bottom of the first trench, wherein the second ion implantation has an energy lower than an energy of the first ion implantation.

3. The method of claim 2, wherein performing the second ion implantation comprises:
    a source material including phosphorus or arsenic, an energy in a range between 8 keV and 60 keV, and a dose in a range between $5\times10^{12}$ and $1\times10^{14}$ atoms/cm$^2$; or
    a source material including boron or boron fluoride, an energy in a range between 5 keV and 30 keV, and a dose in a range between $5\times10^{12}$ and $1\times10^{14}$ atoms/cm$^2$.

4. The method of claim 2, wherein the substrate structure further comprises a second structure configured to form a second type device; the method further comprising, prior to performing the first ion implantation:
    forming a first barrier layer on the second structure; and
    removing the first barrier layer after the second ion implantation and prior to performing the pull-back process.

5. The method of claim 4, further comprising, after removing the first barrier layer:
    forming a second barrier layer on the first structure while exposing the second structure;
    performing a third ion implantation into the second structure.

6. The method of claim 5, further comprising:
    performing a fourth ion implantation into a second trench adjacent to the second structure to form a second doped region in the substrate at a bottom of the second trench, wherein the fourth ion implantation has an energy lower than an energy of the third ion implantation.

7. The method of claim 6, wherein performing the fourth ion implantation comprises:
    a source material including phosphorus or arsenic, an energy in a range between 8 keV and 60 keV, and a dose in a range between $5\times10^{12}$ and $1\times10^{14}$ atoms/cm$^2$; or
    a source material including boron or boron fluoride, an energy in a range between 5 keV and 30 keV, and a dose in a range between $5\times10^{12}$ and $1\times10^{14}$ atoms/cm$^2$.

8. The method of claim 5, wherein performing the third ion implantation comprises:
    a source material including phosphorus or arsenic, an energy in a range between 100 keV and 700 keV, and a dose in a range between $1\times10^{12}$ and $8\times10^{12}$ atoms/cm$^2$; or
    a source material including boron, an energy in a range between 60 keV and 300 keV, and a dose in a range between $1\times10^{12}$ and $8\times10^{12}$ atoms/cm$^2$.

9. The method of claim 5, wherein the substrate structure further comprises a third structure configured to form a third type device, the third type device having an operating voltage lower than an operating voltage of the first type device;
    the first barrier layer is on the third structure; and
    the second barrier layer is on the third structure.

10. The method of claim 2, wherein the substrate structure further comprises a third structure configured to form a third type device, the third type device having an operating voltage lower than an operating voltage of the first type device; the method further comprising, prior to performing the second ion implantation:
    forming a third barrier layer on the third structure.

11. The method of claim 1, further comprising, after performing the rounding process, filling the first trench with an insulating material.

12. The method of claim 11, further comprising, after filling the first trench:
    removing the hardmask layer and the insulating layer to expose the active region;
    forming a gate structure on the active region.

13. The method of claim 11, wherein the insulating material comprises silicon oxide.

14. The method of claim 1, wherein performing the rounding process comprises oxidizing the exposed corner portion and forming an oxide layer on the bottom and sidewalls of the first trench.

15. A method for manufacturing a semiconductor device, the method comprising:
    providing a substrate structure including a substrate having a first structure and a second structure, each of the first and second structures comprising an active region isolated by trenches, an insulating layer on the active region, and a hardmask layer on the insulating layer;
    forming a first barrier layer on the second structure;
    performing a first ion implantation into a first structure configured to form a first type device;
    performing a pull-back process on the hardmask layer and on the insulating layer of the first structure to form a receded hardmask layer and a receded insulating layer and expose a corner portion of the active region; and
    performing a rounding process on the exposed corner portion.

16. A method for manufacturing a semiconductor device, the method comprising:
    providing a substrate structure including a substrate having a plurality of structures, each of the structures comprising an active region isolated by trenches, an insulating layer on the active region, and a hardmask layer on the insulating layer, the plurality of structures comprising a first structure configured to form a first type device and a second structure configured to form a second type device, the second type device having an operating voltage lower than an operating voltage of the first type device;

forming a barrier layer on the second structure;

after forming the barrier, performing a first ion implantation into the first structure;

performing a pull-back process on the hardmask layer and on the insulating layer of the first structure to form a receded hardmask layer and a receded insulating layer and expose a corner portion of the active region; and performing a rounding process on the exposed corner portion.

17. The method of claim 1, wherein the insulating layer comprises silicon oxide, and the hardmask layer comprises silicon nitride.

18. The method of claim 1, wherein the active region is a well region.

19. The method of claim 15, wherein the substrate structure further comprises a third structure configured to form a third type device, the third type device having an operating voltage lower than an operating voltage of the first type device; the method further comprising, prior to performing the first ion implantation:

forming a third barrier layer on the third structure.

* * * * *